US010365558B2

(12) United States Patent
Jansen et al.

(10) Patent No.: US 10,365,558 B2
(45) Date of Patent: Jul. 30, 2019

(54) APPARATUS AND METHOD FOR MANUFACTURING A PELLICLE, AND A PELLICLE

(71) Applicant: ASML Netherlands B.V., Veldhoven (NL)

(72) Inventors: Maarten Mathijs Marinus Jansen, Eindhoven (NL); Juan Diego Arias Espinoza, Eindhoven (NL); Johannes Peterus Henricus De Kuster, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 60 days.

(21) Appl. No.: 15/101,506

(22) PCT Filed: Nov. 19, 2014

(86) PCT No.: PCT/EP2014/074977
§ 371 (c)(1),
(2) Date: Jun. 3, 2016

(87) PCT Pub. No.: WO2015/082214
PCT Pub. Date: Jun. 11, 2015

(65) Prior Publication Data
US 2016/0313637 A1    Oct. 27, 2016

(30) Foreign Application Priority Data

Dec. 5, 2013 (EP) .................... 13195872

(51) Int. Cl.
*G03F 1/62* (2012.01)
*G03F 1/24* (2012.01)
(Continued)

(52) U.S. Cl.
CPC ............... *G03F 1/62* (2013.01); *G03F 1/24* (2013.01); *G03F 1/66* (2013.01); *G03F 7/70983* (2013.01)

(58) Field of Classification Search
CPC ........... G03F 1/62; G03F 1/66; G03F 7/70983
(Continued)

(56) References Cited

U.S. PATENT DOCUMENTS 6,593,035 B1 * 7/2003 Levinson ............... G03F 1/62
428/14
6,623,893 B1 9/2003 Levinson et al.
(Continued)

FOREIGN PATENT DOCUMENTS

JP 2002049145 2/2002
JP 2005-070191 A 3/2005
(Continued)

OTHER PUBLICATIONS

International Search Report directed to related International Patent Application No. PCT/EP2014/074977, dated Feb. 25, 2015; 4 pages.
(Continued)

*Primary Examiner* — Daborah Chacko-Davis
(74) *Attorney, Agent, or Firm* — Sterne, Kessler, Goldstein & Fox, P.L.L.C.

(57) ABSTRACT

An apparatus for manufacturing a pellicle, the apparatus comprising: a stressing assembly for stressing a film; and a substrate support for supporting a substrate, the stressing assembly and the substrate support being capable of relative movement so as to bring the substrate into contact with the film when the film is stressed.

14 Claims, 4 Drawing Sheets

(51) Int. Cl.
*G03F 1/66* (2012.01)
*G03F 7/20* (2006.01)

(58) Field of Classification Search
USPC .......................................................... 430/5
See application file for complete search history.

(56) References Cited

U.S. PATENT DOCUMENTS

| | | |
|---|---|---|
| 2010/0195076 A1 | 8/2010 | Mueller et al. |
| 2011/0189594 A1 | 8/2011 | Sekihara |

FOREIGN PATENT DOCUMENTS

| | | |
|---|---|---|
| JP | 2005-128512 A | 5/2005 |
| JP | 2005-148620 A | 6/2005 |
| JP | 2013195852 | 9/2013 |
| WO | WO 2005029181 | 3/2005 |
| WO | WO 2009043885 | 4/2009 |
| WO | WO 2014154452 | 10/2014 |
| WO | WO 2013141325 | 8/2015 |

OTHER PUBLICATIONS

International Preliminary Report on Patentability and Written Opinion of the International Searching Authority directed to related International Patent Application No. PCT/EP2014/074977, dated Jun. 7, 2016; 7 pages.
English-language abstract for Japanese Publication No. 2002049145, published Feb. 15, 2002; 2 pages.
English-language abstract for Japanese Publication No. 2013195852, published Sep. 30, 2013; 1 page.
English-language abstract for Japanese-language Publication No. WO 2013141325, published Sep. 26, 2013; 2 pages.

* cited by examiner

FIG. 6

APPARATUS AND METHOD FOR MANUFACTURING A PELLICLE, AND A PELLICLE

CROSS-REFERENCE TO RELATED APPLICATIONS

This application claims the benefit of EP application 13195872.0, which was filed on 5 Dec. 2013, and which is incorporated herein in its entirety by reference.

FIELD

The present invention relates to an apparatus and method for manufacturing a pellicle, and a pellicle

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 5-20 nm, may be used to form smaller features on a substrate than a conventional lithographic apparatus (which may for example use electromagnetic radiation with a wavelength of 193 nm).

The small size of features patterned using EUV radiation means that any particulate contamination within a lithographic apparatus can have significant detrimental effects on a manufactured integrated circuit. For example, if a particle was present on a patterning device during patterning it may cause an image of the particle to be formed on a substrate. It is known to use a pellicle to protect a patterning device from particle contamination, so as to prevent any degradation in the performance of the lithographic apparatus in the presence of some particles. However, to form a pellicle which is sufficiently transparent to EUV radiation so as to not reduce the performance of the lithographic apparatus each pellicle must be made of an extremely thin film. Thin films tend to be flexible and have a tendency to deflect when exposed to pressure gradients, mechanical vibrations or mechanical stresses when in use or in transit. Any such deflection of a pellicle can cause the pellicle to come into contact with other components of the lithographic apparatus, which may cause damage to the pellicle, or degradation in patterning performance.

In known pellicles a support grid may be provided across the pellicle in order to prevent deflection of the pellicle. However, such a support grid may cause patterning of the EUV radiation.

SUMMARY

It is an object of the invention to obviate or mitigate one or more of the problems associated with known pellicles.

According to a first aspect of the present invention there is provided an apparatus for manufacturing a pellicle the apparatus comprising: a stressing assembly for stressing a film; and a substrate support for supporting a substrate, the stressing assembly and the substrate support being capable of relative movement so as to bring the substrate into contact with the film when the film is stressed.

The apparatus provides a mechanism by which a pellicle can be imparted with a tensile stress, or pre-stressed, during manufacture. Pre-stressing improves the resistance of the pellicle to deflection when exposed to differential pressures in use, and may also reduce the occurrence of wrinkles in a pellicle film.

The stressing assembly may be arranged to expose a first side of the pellicle film to a first pressure and to expose a second side of the pellicle film to a second pressure different to the first pressure.

The use of a differential pressure to pre-stress a pellicle film allows a uniform pressure to be applied to the surface of a pellicle film without risking rupturing the film by use of a mechanical device which may cause points of high pressure.

The first pressure may be above atmospheric pressure. The second pressure may be substantially equal to atmospheric pressure.

The apparatus may further comprise a pressure monitor arranged to monitor the difference in pressure between the first pressure and the second pressure.

A pressure monitor provides a simple mechanism for monitoring the differential pressure applied to a film.

The apparatus may further comprise a stress monitor, arranged to monitor a property of the pellicle film indicative of the stress in the pellicle film.

The stress monitor may be a deflection monitor.

The deflection of a film provides an easily detectable indication of the stress within the film. Therefore, monitoring the deflection of a portion of a film allows the stress to be determined.

The stressing assembly may comprise a chamber, the chamber may comprise a first region arranged to be maintained at the first pressure and a second region arranged to be maintained at the second pressure.

The first region may comprise a gas inlet.

The use of a gas inlet allows a gas at a pressure above atmospheric pressure to be introduced to the chamber, increasing the pressure in the chamber. This provides a simple mechanism of causing a differential pressure across a film.

The first region may comprise a leak valve, thereby allowing control of the exit of gas from the chamber. This allows the pressure within the chamber to be regulated to achieve a predetermined pressure.

The chamber may further comprise a film support disposed around an inner surface of the chamber between the first region and the second region.

The film support may define a circular aperture between the first region and the second region.

The use of a circular aperture provides compatibility with widely used circular wafers.

The substrate support may comprise a flat circular surface arranged parallel with and concentric with the circular aperture.

According to a second aspect of the invention there is provided a pellicle comprising a pellicle film and a pellicle frame wherein the pellicle film is mounted on the pellicle frame under tensile stress.

The pellicle comprises a material selected from polysilicon, graphene, multilayers of Nb/Mo/Si, layers of carbon nanotubes, and multilayers formed with two or more of these materials.

The pellicle comprises a capping layer on top or in a sandwich kind.

The tensile stress may be sufficient to prevent wrinkles in the pellicle film.

A pellicle film which is not stressed may wrinkle even when under no differential pressure. As such, providing sufficient tensile stress to prevent wrinkles improves the uniformity of the film, and reduces the tendency for the film to deflect under even small differential pressures.

The tensile stress may be at least a predetermined tensile stress.

The predetermined tensile stress may be based upon at least one of: a geometry of the pellicle film; a maximum permitted deflection by a portion of the pellicle film in use; a maximum differential pressure expected to be encountered by the pellicle film in use; and a Young's modulus of the pellicle film.

For some applications the maximum permitted deflection by a portion of the pellicle film in use may be approximately 1 millimeter. This is merely exemplary, however as the maximum permitted deflection may vary depending upon application. For example, for applications which are sensitive to small deflections of the pellicle film, the maximum permitted deflection by a portion of the pellicle film in use may be approximately 0.5 millimeters.

The maximum differential pressure expected to be encountered by the pellicle film may be approximately 2 Pa.

The pellicle film may be rectangular. A rectangular pellicle would provide convenient protection to a rectangular patterning device, which may be used in a lithographic apparatus.

In other embodiments, alternative pellicle shapes may be selected where appropriate. For example, the pellicle film may be circular, or the pellicle film may be square.

The greatest tensile stress in the pellicle film may be greater than 150 MPa. Increased tensile stress in the pellicle film reduces the tendency of the film to deflect. A maximum tensile stress of 150 MPa may be sufficient to prevent excessive deflection of the pellicle film in some applications. In other applications, the greatest tensile stress in the pellicle film may be greater than 200 MPa, and to reduce deflection further, the greatest tensile stress in the pellicle film may be greater than 250 MPa.

There may be an inhomogeneous distribution of tensile stress within the pellicle film. The tensile stress may be greatest at the centre of the pellicle film.

An inhomogeneous distribution of tensile stress allows stress to be concentrated where it is most needed in a film, for example furthest from the pellicle frame. In a rectangular pellicle film, the corner regions would require less tensile stress to resist deflection (due to the proximity of the pellicle frame) than the centre of the pellicle film. Therefore a higher tensile stress in the centre of the film than in the corners could improve the resistance to deflection in the centre of the film without requiring that the whole film be subjected to increased stress.

According to a third aspect of the invention there is provided a lithographic tool comprising a pellicle according to the second aspect of the invention.

The provision of a pellicle within a lithographic apparatus allows sensitive regions of the lithographic apparatus to be protected from particle contamination.

According to a fourth aspect of the invention there is provided a patterning device assembly comprising: a patterning device being capable of imparting a radiation beam with a pattern in its cross-section to form a patterned radiation beam; and a pellicle according to the second aspect of the invention, the pellicle being arranged adjacent to the patterning device so as to prevent particles from contacting the patterning device.

The provision of a pellicle in combination with a patterning device allows the patterning device to be protected from particle contamination, reducing the likelihood of any degradation in imaging performance due to particles landing on the patterning device.

According to a fifth aspect of the invention there is provided a method for manufacturing a pellicle, the method comprising: providing a film; causing the film to become mechanically stressed; providing a substrate; moving the substrate and the film towards one another when the pellicle film is stressed so as to bring the substrate into contact with the stressed film; attaching the stressed film to the substrate; and patterning the substrate so as to form a frame, the frame supporting the film in a stressed configuration.

The film may be mechanically stressed by the application of a differential pressure across the pellicle film.

Applying the differential pressure may comprise exposing a first side of the pellicle film to a pressure greater than atmospheric pressure.

According to a sixth aspect of the invention there is provided a method of manufacturing a patterning device assembly comprising: performing a method according to the fifth aspect of the invention; providing a patterning device; and attaching the pellicle to the patterning device.

According to a seventh aspect of the invention, there is provided a method comprising projecting a patterned beam of radiation onto a substrate, wherein a pellicle according to the second aspect of the invention is provided in the path of the beam of radiation adjacent to a patterning device which patterns the beam of radiation.

According to an eighth aspect of the invention there is provided a pellicle manufactured using the apparatus according to the first aspect of the invention.

According to an eight aspect of the invention there is provided a casing provided with a pellicle frame and the pellicle according to the second or eight aspect of the invention.

According to a ninth embodiment there is provided a casing provided with a patterning device, a pellicle frame and the pellicle according to the second or eight aspect of the invention.

It will be appreciated that features and advantages described with reference to one aspect of the invention can be used with other aspects of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
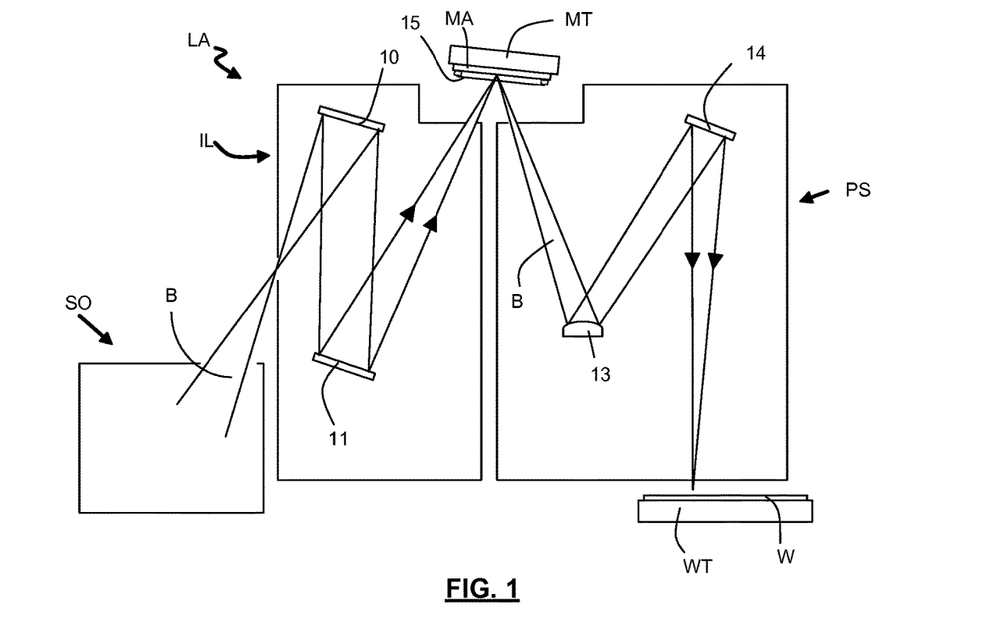
FIG. 1 depicts a lithographic system comprising a lithographic apparatus and a radiation source according to an embodiment of the invention.

FIG. 1 shows a lithographic system including a pellicle according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 may be of a type which is referred to as a laser produced plasma (LPP) source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

A pellicle 15 is provided adjacent to the patterning device MA. The pellicle 15 is provided in the path of the radiation beam B such that radiation beam B passes through the pellicle 15 both as it approaches the patterning device MA from the illumination system IL and as it is reflected by the patterning device MA towards the projection system PS. The pellicle 15 comprises a thin film which is substantially transparent to EUV radiation. However, while transparent to EUV radiation, the pellicle 15 acts to protect the patterning device MA from particle contamination. The pellicle 15 is positioned at a distance from the patterning device MA which is sufficient that any particles which are incident upon the surface of the pellicle 15 are not in the focal plane of the radiation beam B. This separation between the pellicle 15 and the patterning device MA, acts to reduce the extent to which any particles on the surface of the pellicle 15 impart a pattern to the radiation beam B. It will be appreciated that where a particle is present in the beam of radiation B, but at a position which is not in a focal plane of the beam of radiation B (i.e. not at the surface of the patterning device MA), then any image of the particle will not be in focus at the surface of the substrate W.

In order to provide protection form particles reaching the patterning device MA, the pellicle 15 should be positioned close to the patterning device MA. However, the pellicle 15 should not come into contact with the patterning device MA. Not only could this damage the patterning device MA or the pellicle 15, it could allow the pellicle 15, and any particles on the pellicle 15, to come into the focal plane of the lithographic apparatus in which the patterning device was installed. A separation of between approximately 1.5 and 2.5 mm may be an appropriate separation between a pellicle and patterning device MA in some applications. For example, in an embodiment a separation of approximately 2 mm between a pellicle and a patterning device may be used. In such an embodiment, the pellicle may be permitted to be deflected by 0.5 mm in either direction (i.e. towards or away from the patterning device).

Known pellicles tend to be thin flexible films. However, such films are susceptible to being deflected or deformed when exposed to the differential pressures, for example during loading or unloading to the lithographic apparatus. For example, when a patterning device is loaded or unloaded from a lithographic apparatus, it will be passed through a load lock. A pellicle may be mounted on a patterning device, enclosing a volume of gas between the pellicle film and the surface of the patterning device. Evacuation or pressurization of a load lock may involve significant differential pressures. As the gas is evacuated from (or returned to) the load lock, the volume between the patterning device and the pellicle will equalize with the load lock pressure, but at a slower rate, depending on the rate at which gas can escape from the volume enclosed by the pellicle. In these conditions, a flexible pellicle may become deflected.

A further situation in which a pellicle may be exposed to a differential pressure is when installed in a lithographic apparatus. A flow of gas from the optics environment may be directed towards the patterning device and pellicle, which may cause the pellicle to experience a differential pressure.

Furthermore, pellicles which are un-stressed may wrinkle due to slight irregularities or deformities in their mounting or clamping.

However, it has been realized that by using a pellicle which is pre-stressed, the tendency to deflect under moderate differential pressures is significantly reduced, reducing the likelihood of a pellicle coming into contact with other system components. Furthermore, the use of a pre-stressed pellicle reduces the occurrence of wrinkles in the pellicle.

Figure 2:
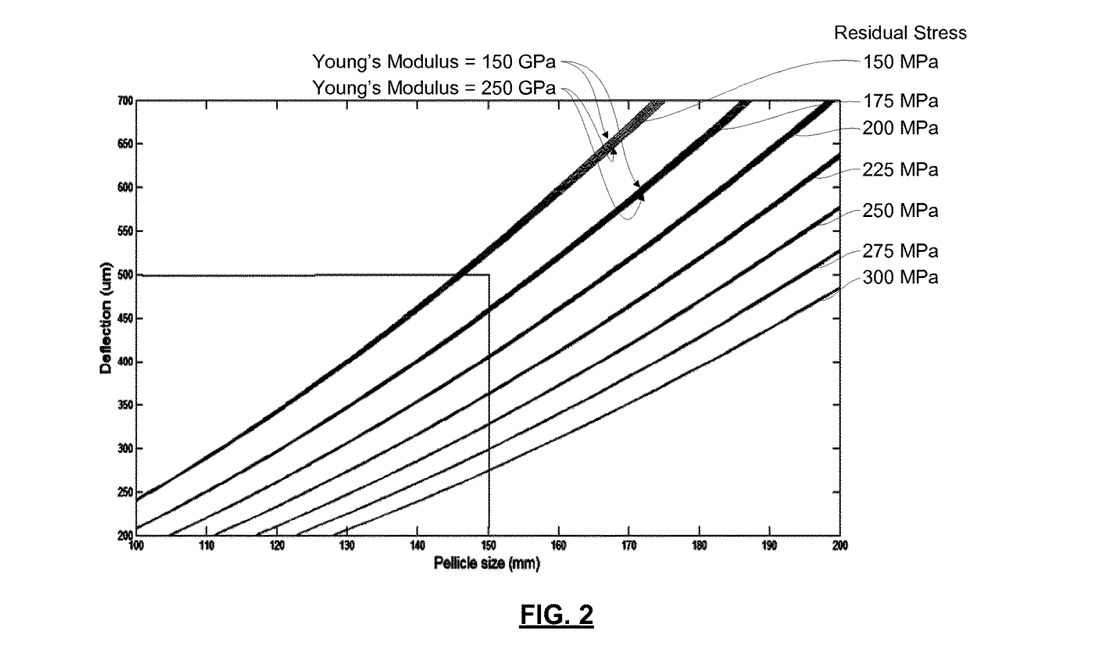
FIG. 2 is a plot of the deflection of pellicles according to embodiments of the invention.

FIG. 2 shows the results of a simulation of the expected deflection of a range of possible pellicle sizes, when the pellicles are pre-stressed homogenously with different residual stress amounts, and when exposed to a pressure gradient. The pressure gradient simulated was 2 Pa. The thickness of the films simulated was 55 nm. The residual stress amounts simulated ranged from 150 MPa to 300 MPa in steps of 25 MPa. The Young's modulus of the simulated films ranged from 150 GPa to 250 GPa. The simulated pellicles are square, having a side length of between 100 mm and 200 mm.

It can be seen that as the pellicle size (x-axis, mm) increases the expected deflection (y-axis, μm) also increases for any given residual stress amount. It can also be seen that for a given pellicle size the deflection decreases as the residual stress is increased. For example, for a pellicle having a side length of 150 mm with a residual stress of 150 MPa, the deflection is around 540 μm. However, for a pellicle having a side length of 150 mm with a residual stress of approximately 300 MPa, the deflection is reduced to approximately 275 μm. It can also be seen that the Young's modulus of the film has a smaller effect on the deflection than the residual stress. For each residual stress value simulated several Young's modulus values are shown, with a higher Young's modulus resulting in a slightly reduced deflection for a given stress and pellicle size. However, rather than having a significant effect on the deflection, the Young's modulus is shown as a slight thickening to each of the plotted lines, with the upper edge of each line representing the deflection of the film for a Young's modulus of 150 GPa, and the lower edge of each line representing the deflection of the film for a Young's modulus of 250 GPa.

The relationship between the deflection of a particular pellicle under a particular differential pressure can be calculated using the Timoshenko relationship for the load-deflection behavior of membrane (S Timoshenko, Theory of Plates and Shells, McGraw-Hill, 1940). The Timoshenko relationship can be expressed by the following equation:

$$\frac{P}{D} = \frac{c_1 t}{a^2}\sigma + \frac{c_2 E t}{(1-v)a^4}D^2$$

where:
P is the differential pressure,
D is the deflection of the centre of the film,
t is the film thickness,
a is the half-length of the side of the film,
$c_1$ is a geometric constant,
$c_2$ is a geometric constant,
E is the Young's modulus, and
v is the Poisson's ratio.

It will be appreciated that if a pellicle is pre-stressed by an insufficient amount, that pellicle will deflect more than is acceptable within a given application. It will further be appreciated that deflection could otherwise be reduced by using a material having an increased Young's modulus.

Figure 3A:
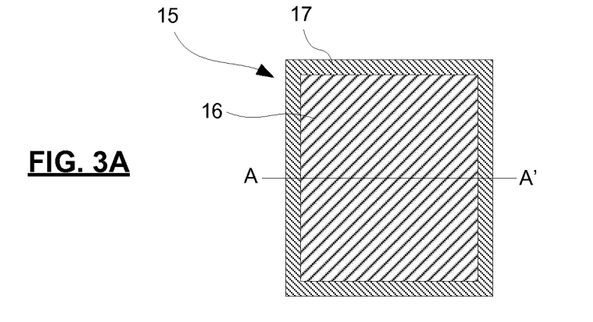
FIG. 3A-3B depict a pellicle according to an embodiment of the invention.

FIG. 3 shows the pellicle 15 in more detail. FIG. 3A shows a plan view of the pellicle 15. The pellicle 15 is rectangular and comprises a pellicle film 16 and a pellicle frame 17. The pellicle film 16 comprises a thin film which is substantially transparent to EUV radiation. It will be appreciated that the pellicle film may be formed from any material which is substantially transparent to EUV radiation while providing a barrier to particle contamination.

For example, the pellicle film 16 may be formed from a multi-layer stack of molybdenum (Mo) and zirconium silicide (ZrSi). The Mo/ZrSi stack may be capped on one or both sides with molybdenum silicide (MoSi). In an alternative example the pellicle film 16 may be formed from polysilicon (pSi). One or both of the sides of the polysilicon film may be capped with a silicon nitride (SiN) layer. Other materials, for example graphene, may be suitable for use as a pellicle film in other embodiments. The capping layers referred to above (e.g. MoSi, SiN) may help to reduce the effect of hydrogen radicals (or other reactive species) which may be generated from hydrogen gas in the presence of EUV radiation, and which may cause damage to the pellicle film. The pellicle may comprise multilayers of Nb/Mo/Si, layers of carbon nanotubes, or multilayers formed with two or more of these materials. The pellicle may comprise a capping layer on top or in a sandwich kind.

The thickness of the pellicle film 16 will depend on the material properties (e.g. strength, EUV transparency). For example, a pellicle film made from a Mo/ZrSi multilayer stack may be approximately 25 nm thick. Alternatively, a pellicle made from polysilicon may be approximately 40 nm thick. A graphene pellicle may be, for example, approximately 10 nm thick.

Figure 3B:
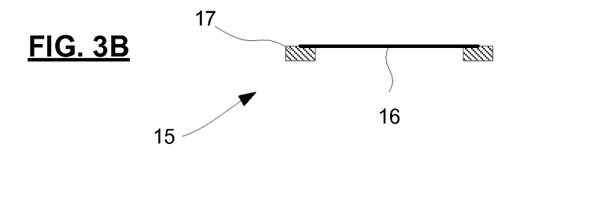

The pellicle frame 17 has a rectangular external shape, having a rectangular opening at its centre. The pellicle film 16 is attached to the pellicle frame 17 in such a way that it is mechanically stressed. FIG. 3B shows a cross-section of the pellicle 15 along the line A-A'. It can be seen that the pellicle frame 17 does not extend across the width of the pellicle film 16, leaving the pellicle film 16 un-supported where it extends over the rectangular opening in the pellicle frame 17. The pellicle frame 17 has a thickness which is substantially greater than the thickness of the pellicle film 16. The pellicle frame 17 may, for example, be approximately 2 mm thick.

In use, the pellicle 15 is attached to the side of the patterning device MA which is exposed to EUV radiation, the pellicle film 16 being held at a distance from the surface of the patterning device MA which corresponds to the thickness of the pellicle frame 17.

The pellicle frame 17 may further comprise gas channels and filters (not shown) to allow the equalization of gas pressure between volume of gas enclosed by the pellicle and the patterning device and the external environment. It will be appreciated that the size and possible flow rate of gas through the channels and the filters will affect the differential pressure experienced by the pellicle film during loading or unloading.

The pellicle 15 has dimensions which are selected for use with a particular application. For example, the pellicle 15 may be designed to protect a reticle having a patterned area which is approximately 110 mm by 145 mm. Such a pellicle 15 would have a pellicle frame 17 which was larger than the reticle, having an opening which was at least as big as the reticle.

Figure 4:
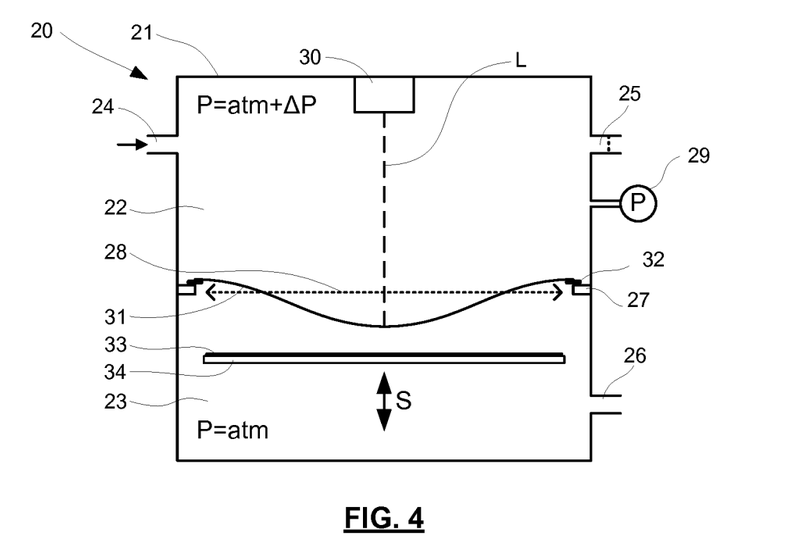
FIG. 4 depicts an apparatus according to an embodiment of the invention.

FIG. 4 shows a stressing assembly 20 in which the pellicle 15 can be manufactured. The stressing assembly 20 comprises a chamber 21 having a first region 22 a second region 23. The first region 22 has a gas inlet 24 and a first leak valve 25. The second region has an opening 26. A support 27 projects from the internal wall of the chamber 21, and defines an opening 28 between the first region 22 and the second region 23. The opening 28 is circular. A pressure monitor 29 is connected to the first region 22 so as to monitor the pressure within the first region 22. The pressure monitor 29 may be any form of pressure monitor. The pressure monitor 29 may be provide a measure of the pressure within the first region with an accuracy of around 0.1 Pa. A laser distance monitor 30 is provided within the chamber 21. The laser distance monitor 30 can be used to measure distances within the chamber 21, and will be described in more detail below.

Figure 5:
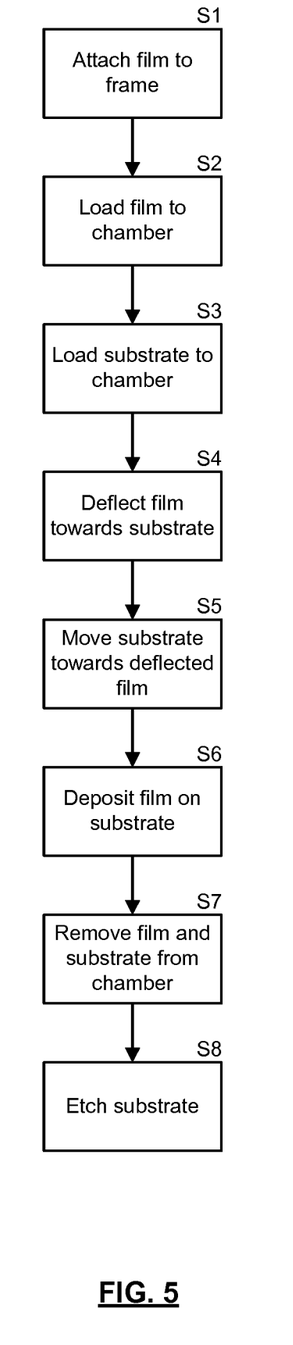
FIG. 5 depicts a flow chart illustrating a method according to an embodiment of the invention.

A process by which a pre-stressed pellicle can be manufactured using the stressing assembly 20 shown in FIG. 4 is now described with reference to FIG. 5, which is a flow chart. At step S1 a film 31 is attached to a frame 32. The frame 32 is an annular frame and the film 31 a circular film which is attached to the frame 32 around the perimeter of the film 31. The film 31 is a thin film suitable for use as a pellicle. The film 31 may, for example, be formed from polysilicon or be a multilayer structure, as described above with reference to the pellicle film 16.

At step S2, the film 31 and frame 32 are loaded into the chamber 21. Within the chamber, the frame 32 is supported by the support 27 at the opening 28 between the first region 22 and the second region 22. The film 31 and frame 32 completely cover the opening 28.

At step S3, a substrate 33 is loaded into the second region 23 of the chamber 21. The substrate 33 is a flat circular substrate of greater thickness and mechanical strength than the film 31. The substrate 33 is more mechanically rigid than the film 31. The substrate 33 is sized so as to be of a similar size to the opening 28. The substrate 33 is supported on a substrate support 34 within the second region 23 so as to be held flat and substantially parallel with the opening 28 and the film 31. The substrate support 34 is capable of translational movement in both directions perpendicular to the plane in which the substrate 33 is supported, as shown by arrow S.

At step S4 a gas supply (not shown) is connected to the gas inlet 24, to provide a flow of gas into the chamber 21. The gas can be any gas, for example an inert gas such as nitrogen. A seal is created between the frame 32 and the support 27, preventing the gas from flowing from the first region 22 to the second region 23. Gas flowing into the gas inlet 24 flows out from the first leak valve 25. However, the first leak valve 25 restricts the flow of gas from within the first region 22 of the chamber 21, causing the pressure within the first region 22 to be raised with respect to atmospheric pressure. The opening 26 allows gas to flow between the environment external to the chamber 21 and the second region 23. However, unlike the first region 22, there is no gas inlet providing a flow of gas to the second region 23. The opening 26 therefore allows the pressure to equalize between these areas. This ensures that the pressure in the second region 23 is substantially the same as the external environment (i.e. at atmospheric pressure). In an embodiment the gas flow through the opening 26 may be restricted (e.g. the opening may be provided with leak valve).

A differential pressure $\Delta P$ is thus established between the first region 22 and the second region 23, the differential pressure $\Delta P$ being controlled by regulating the flow of gas into the inlet 24. That is, the flow rate may be increased or decreased so as to maintain the pressure within the first region 22 (as monitored by the pressure monitor 29) at a predetermined level.

The differential pressure between the first region 22 and the second region 23 causes the film 31 to experience the differential pressure $\Delta P$ between the side which is facing the first region 22 and the side which is facing the second region 23. This differential pressure causes the centre of the film 31 to be deflected towards the second region 23, the perimeter of the film 31 being prevented from deflecting by its attachment to the frame 32. This deflection of the centre of the film 31 causes the film 31 to stretch and to become stressed. The extent of the deflection and stress within the film 31 will be determined by various mechanical properties of the film 31 (e.g. the Young's modulus of the film material, the thickness and the diameter of the film), and the differential pressure $\Delta P$. The differential pressure $\Delta P$ is measured by the pressure monitor 29, which is connected to the first region 22. The deflection of the centre of the film 31 is measured by the laser distance monitor 30.

The laser distance monitor 30 comprises an emitter (not shown) which emits a laser beam L, which is directed towards the film 31. The laser beam L is reflected by the film 31 and the reflected beam is detected by a detector (not shown) which is also comprised within the laser monitor 30. The time taken for the laser beam to travel from the emitter to the film 31 and back to the detector is measured, allowing an accurate determination of the distance between the laser distance monitor 30 and the film 31 to be made. This measurement can be carried out periodically (e.g. several times per second), so as to provide a periodic update of the distance between the position of the laser distance monitor 30 and the film 31, the difference between measurements of distance providing a measure of the deflection of the film 31 under the effect of the differential pressure $\Delta P$.

The measured deflection is used to control the differential pressure $\Delta P$ (also as described above) so as to cause the film to be deflected by a predetermined amount. It will be appreciated that for a given film, having known material properties, there will be a well-defined relationship between the differential pressure, the deflection and the stress within the film. Therefore, if a predetermined deflection is brought about, there will be a predetermined stress distribution within the film 31.

At step S5, whilst the film 31 is stretched by the differential pressure $\Delta P$ between the regions 22, 23 of the chamber, the substrate 33 is moved, by the action of the substrate support 34, towards the first region 21 (and therefore also towards the deflected film 31).

At step S6, the substrate 33 is brought into contact with the film 31. The first point of contact between the film 31 and the substrate 33 is at the centre of the film 31, which is the point at which the film 31 is most deflected. Once initial contact is made, the substrate 33 is moved further towards the first region 22. The area of contact between the film and the substrate increases as the substrate is moved further towards the first region 22.

As described above, before contact between the film 31 and the substrate 33, the film 31 will be stretched by the applied differential pressure $\Delta P$. As the film 31 is gradually brought into contact with the substrate 33, the film 31 retains this stretched characteristic, provided the film 31 is not allowed to relax to an un-stressed state. As subsequent portions of the film 31 are brought into contact with the substrate 33, during step S6, the film 31 is forced into a flat (i.e. not deflected) arrangement. This is because of the mechanical rigidity of the substrate 33 and pressure applied by the substrate support 34 on which it is supported and moved. However, the film 31 is not allowed to slip against the surface of the substrate 33, preventing any relaxation of the stress within the film 31. To prevent relaxation of the film 31, the film 31 is attached to the substrate 33 by a glue. The glue may be an EUV resistant glue. That is, a glue is used which does not weaken when exposed to EUV radiation. This glue may be applied to the substrate 33 prior to being brought into contact with the film 31 in ring around the perimeter of the substrate 33. Movement of the substrate 33 towards the film 31 is stopped when there is a predetermined area of contact between the deflected film 31 and the substrate 33. The film 31 is caused to cover an area of the substrate 33 which is at least as large as the pellicle. For example, the contact area between the film 31 and the substrate 33 may be between 10 and 20% greater than the area of the final pellicle.

At step S7, and once the film 31 has been brought into contact with the substrate 33 a predetermined amount, the film 31, frame 32 and substrate 33 are removed from the chamber 21. The frame 32 is then removed from the film 31, leaving the stressed film 31 attached to the surface of the substrate 33. The substrate 33 is smaller than the film 31 and the frame 32. As such, excess film material may also be removed from beyond the perimeter of the substrate 33, leaving a portion of the film 31, which becomes the pellicle film 16, and which has a diameter the same or less than that of the substrate 33. The processing to remove excess film material at step S7 may generate particles, which may become lodged on the surface of the pellicle film 17 around the perimeter of the pellicle film 17. If present in the region of the pellicle film 17 which is exposed to the patterned radiation beam B in use, the particles could cause shadows on the radiation beam B. The predetermined contact area between the film 31 and the substrate 33 described at step S6 may therefore be selected to provide a region of the pellicle film 17 around the perimeter of the pellicle 15 which may become contaminated by particles during processing, but that will not interfere with subsequent use of the pellicle 15. That is, the pellicle 15 may be oversized by an amount (e.g. 10 to 20%) to allow an additional region of film which is intended to reduce the effect of processing carried out at step S7 on the performance of the pellicle 15.

Figure 6:
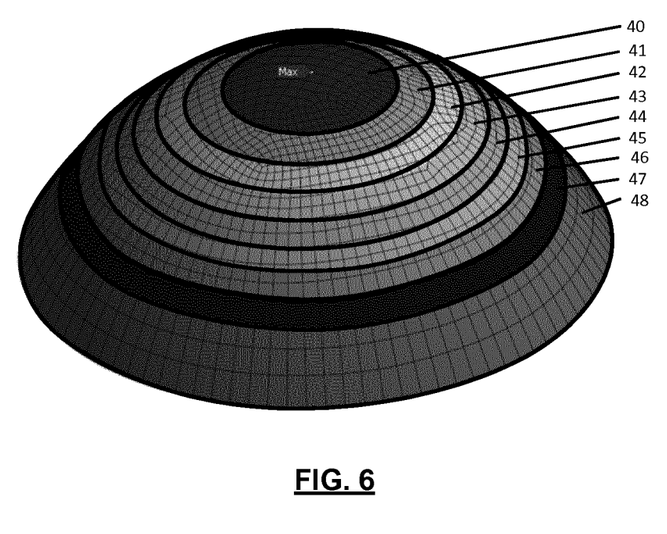
FIG. 6 is a plot of the stress within a stressed film according to an embodiment of the invention.

It will be appreciated that there is a distribution of stress within the film 31. FIG. 6 shows an example of the stress within a stressed film 31 when deflected by a differential pressure ΔP. The differential pressure ΔP can be altered so as to achieve a desired stress distribution within the film 31. The film used to simulate the stress distribution shown in FIG. 6 was a circular Mo/ZrSi multi-layer film with a thickness of 25.6 nm, 30 mm in diameter having a Young's modulus of 285 GPa, with a differential pressure of ΔP 100 Pa. It is noted that the size of a film does not affect the stress distribution. Therefore, the simulation results for a 30 mm diameter film are appropriate to show the stress distribution for any circular film.

The centre of the film 31 is subjected to a greater stress than the periphery of the film 31. A region 40 at the centre of the film 31 has the highest stress within the film. A region 48, at the periphery of the film 31, with the stress gradually decreasing through regions 41 to 47, which are disposed sequentially, and radially between the regions 40 and 48 (i.e. the region 40 having the highest stress, the region 41 having the second highest stress, and so on, with the region 47 having the second lowest stress and the region 48 having the lowest stress). The stress in each of the region 40-48 will depend on the differential pressure ΔP, and can be selected for a particular application. For example, a peak stress in the region 40 may be of the order of several GPa.

When this stress distribution is applied to a pellicle film, such as in the pellicle 15 shown in the FIG. 3, the stress distribution (higher at the centre, reducing towards the circumference) results in there being a greater resistance to deflection in the pellicle film 16 at the centre, and also an increased reduction in the likelihood of wrinkles appearing in the centre of the film, when compared to the regions close to the circumference of the film. Therefore, in order to ensure that the greatest possible reduction in film deflection and wrinkling is brought about, in an embodiment only the centre portion of the film 31 is used to form a pellicle film 16. The outer region of the film 31, which is less stressed, may be removed from the substrate 33.

At step S8, the substrate 33 is lithographically patterned and etched. The patterning may be conducted, for example, by UV lithography. The etching may, for example, be wet etching or dry etching. During the etching process, the centre region of the circular substrate 33 is etched away, providing a rectangular opening. The outer region of the substrate 33 is also etched away, leaving a rectangular frame. This rectangular frame forms the pellicle frame 17 to which is attached the pre-stressed pellicle film 16, as shown in FIG. 3.

During the processing and etching described in steps S6 to S8, the stress within regions of the film 31 may become altered from that which is created by the applied differential pressure and illustrated in FIG. 6. For example, when the pellicle frame 17 is formed by etching the centre region of the substrate 33, the film 31 which was in contact with the removed region of the substrate 33 may relax, altering the stress distribution that results within the pellicle film 16. For example, the peak stress within a film during fabrication may be of the order of GPa, whereas this may be reduced to a peak stress of the order of hundreds of MPa in a pre-stressed pellicle.

It will be appreciated that the regions of the pellicle film 16 which are close to the pellicle frame 17 will be better supported by the pellicle frame 17 than the regions at the centre of the pellicle film 16. Therefore, the lower stress within the regions of the pellicle film towards the pellicle frame 17 does not result in larger deflections in those regions. Moreover, the corner regions of the pellicle film 16 experience the lowest stress, but are the most supported by the pellicle frame 17 as they are supported by the pellicle frame 17 from two sides. As such, the lower stress in the corner regions of the pellicle film 16 does not result in larger deflection in those regions.

While an inhomogeneous stress distribution is described above, and illustrated in FIG. 6, it will be appreciated that in some embodiments a homogenous stress distribution may also be used.

It will be appreciated that in some embodiments alternative distance measurement devices than the laser distance monitor described above may be used, such as an acoustic transducer distance monitor.

In some embodiments, the differential pressure ΔP between the first region 22 and the second region 23 may be controlled in a number of different ways. For example, instead of or as well as regulating the flow of gas into the inlet 24, the rate of gas leaking from the first leak valve 25 may be regulated so as to so as to maintain the pressure within the first region 22 at the predetermined level.

Alternatively, in some embodiments, it may be known that a predetermined differential pressure will cause a predetermined deflection of the film 31. Therefore a distance measurement may be omitted, with a pressure measurement being used to ensure that a required pressure (and consequently deflection and stress within the film) is achieved.

The film 31 may be mounted on the frame 32 in any convenient way. Alternatively, the film 31 may be clamped to the support 27, for example by an annular clamping member which is operable to move towards the support 27 clamping the circumferential edge of the film 31 between the clamping member and the support 27.

The extent of movement of the substrate 33 by the substrate support 34 may depend on the particular film 31. In some embodiments, using a film having a diameter of around 200 mm, the substrate 33 may be moved by, for example, between 1 and 5 millimeters in order to bring it into contact with the deflected film 31. It will be appreciated that initially the substrate 33 should be sufficiently far from the film 31 that the film 31 is allowed to deflect under the effect of differential pressure ΔP without being impeded by the substrate 33.

It will be appreciated that while in above described embodiments a stressing assembly comprising a chamber is used to generate an elevated pressure on one side of the pellicle film so as to stress the pellicle film, it will be appreciated that the pellicle film may be stressed in other ways. For example, in some embodiments, a pellicle film may be stressed by the use of a differential pressure generated by exposing one side of the pellicle film to a pressure lower than atmospheric pressure, causing the film to deflection towards the reduced pressure, as opposed to being deflected away from an elevated pressure.

It will be further appreciated that while in described embodiments a substrate is moved towards a stressed film, in some embodiments a stressed film may instead be moved towards a fixed substrate. Alternatively, both a stressed film and a substrate may be moved towards one another so as to be brought into contact.

It will be appreciated that while a rectangular pellicle is described above, in some embodiments, a pellicle may be otherwise shaped. The pellicle may, for example, be square or circular. Furthermore, the pellicle film 31 and substrate 33 may be shapes other than circular. Adjustments to accommodate different pellicle, pellicle film and substrate geometries can be made to the apparatus shown in FIG. 4. For example, the opening 28 may be shaped to accommodate any form of pellicle film.

In an embodiment, a pellicle according to the invention may form part of a mask inspection apparatus. The pellicle may prevent particles from coming into contact with the mask being inspected. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, a pellicle according to the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

In an embodiment a casing may be provided with a pellicle frame and the pellicle according to the invention in it. The casing may be protecting the pellicle and the pellicle support from dust. The casing may be provided with a venting hole. Alternatively, the casing may be provided with a patterning device, a pellicle frame and the pellicle according to the invention.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm.

Although the radiation source SO shown in FIG. 1 is referred to above as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. An apparatus for manufacturing a pellicle, the apparatus comprising:
   a stressing assembly for stressing a film; and
   a substrate support for supporting a substrate,
   the stressing assembly and the substrate support being capable of relative movement so as to bring the substrate into contact with the film when the film is stressed.
2. An apparatus according to clause 1, wherein the stressing assembly is arranged to expose a first side of the pellicle film to a first pressure and to expose a second side of the pellicle film to a second pressure different to the first pressure.
3. An apparatus according to clause 2, wherein the first pressure is above atmospheric pressure.
4. An apparatus according to clause 2 or clause 3, wherein the second pressure is substantially equal to atmospheric pressure.
5. An apparatus according to any one of clauses 2 to 4, further comprising a pressure monitor, arranged to monitor the difference in pressure between the first pressure and the second pressure.
6. An apparatus according to any preceding clause, further comprising a stress monitor, arranged to monitor a property of the pellicle film indicative of the stress in the pellicle film.
7. An apparatus according to clause 6, wherein the stress monitor is a deflection monitor.
8. An apparatus according to any one of clauses 2 to 7, wherein the stressing assembly comprises a chamber, the chamber comprising a first region arranged to be maintained at the first pressure and a second region arranged to be maintained at the second pressure.
9. An apparatus according to clause 8, wherein the first region comprises a gas inlet.
10. An apparatus according to clause 8 or 9, wherein the first region comprises a leak valve.
11. An apparatus according to any one of clauses 8 to 10, wherein the chamber further comprises a film support disposed around an inner surface of the chamber between the first region and the second region.
12. An apparatus according to clause 11, where the film support defines a circular aperture between the first region and the second region.
13. An apparatus according to clause 12, wherein the substrate support comprises a flat circular surface arranged parallel with and concentric with the circular aperture.
14. A pellicle comprising a pellicle film and a pellicle frame wherein the pellicle film is mounted on the pellicle frame under tensile stress.
15. A pellicle according to clause 14, wherein the pellicle comprises a material selected from polysilicon, graphene, multilayers of Nb/Mo/Si, layers of carbon nanotubes, and multilayers formed with two or more of these materials.
16. A pellicle according to clause 15, wherein the pellicle comprises a capping layer on top or in a sandwich kind.
17. A pellicle according to clause 14, wherein the tensile stress is sufficient to prevent wrinkles in the pellicle film.
18. A pellicle according to any of clauses 14 to 17, wherein the tensile stress is at least a predetermined tensile stress.
19. A pellicle according to clause 18, wherein the predetermined tensile stress is based upon at least one of:
a geometry of the pellicle film;
a maximum permitted deflection by a portion of the pellicle film in use;
a maximum differential pressure expected to be encountered by the pellicle film in use; and
a Young's modulus of the pellicle film.
20. A pellicle according to clause 19, wherein the maximum permitted deflection by a portion of the pellicle film in use is 0.5 millimeters.
21. A pellicle according to clause 19 or 20 wherein the maximum differential pressure expected to be encountered by the pellicle film is 2 Pa.
22. A pellicle according to any one of clauses 19 to 21, wherein the pellicle film is rectangular.
23. A pellicle according to any one of clauses 14 to 22, wherein the greatest tensile stress in the pellicle film is greater than 150 MPa.
24. A pellicle according to any one of clauses 14 to 23, wherein there is an inhomogeneous distribution of tensile stress within the pellicle film.
25. A pellicle according to clause 24, wherein the tensile stress is greatest at the centre of the pellicle film.
26. A lithographic tool comprising a pellicle according to any one of clauses 14 to 25.
27. A patterning device assembly comprising:
a patterning device being capable of imparting a radiation beam with a pattern in its cross-section to form a patterned radiation beam; and
a pellicle according to any one of clauses 14 to 23, the pellicle being arranged adjacent to the patterning device so as to prevent particles from contacting the patterning device.
28. A method for manufacturing a pellicle, the method comprising:
providing a film;
causing the film to become mechanically stressed;
providing a substrate;
moving the substrate and the film towards one another when the pellicle film is stressed so as to bring the substrate into contact with the stressed film;
attaching the stressed film to the substrate; and
patterning the substrate so as to form a frame, the frame supporting the film in a stressed configuration.
29. A method according to clause 28, wherein the film is mechanically stressed by the application of a differential pressure across the pellicle film.
30. A method according to clause 29, wherein applying the differential pressure comprises exposing a first side of the pellicle film to a pressure greater than atmospheric pressure.
31. A method of manufacturing a patterning device assembly comprising: performing a method according to any one of clauses 28 to 30;
providing a patterning device; and
attaching the pellicle to the patterning device.
32. A method comprising projecting a patterned beam of radiation onto a substrate, wherein a pellicle according to any one of clauses 14 to 25 is provided in the path of the beam of radiation adjacent to a patterning device which patterns the beam of radiation.
33. A pellicle manufactured using the apparatus according to any one of clauses 1 to 13.
34. A casing provided with a pellicle frame and the pellicle according to any of clauses 14 to 25 and 33.
35. A casing provided with a patterning device, a pellicle frame and the pellicle according to any of clauses 14 to 25 and 33.

The invention claimed is:
1. An apparatus for manufacturing an intermediate product for a pellicle to be made, the pellicle to be made comprising a pellicle frame and pellicle film supported by the pellicle frame, the pellicle film protecting a patterning device from particle contamination, wherein the apparatus comprises:
a film support to support a film from which a portion is to become the pellicle film;
a substrate support to support a substrate, from which the pellicle frame is to be formed; and
a stressing assembly to impart a tensile stress to the film supported on the film support so as to deflect the film towards the substrate support,
wherein the film support and the substrate support are moveable relative to each other so as to bring the substrate into contact with the film when the film is imparted with tensile stress and deflected towards the substrate support.

2. The apparatus according to claim 1, wherein the stressing assembly is arranged to expose a first side of the film to a first pressure and to expose a second side of the film to a second pressure different to the first pressure.

3. The apparatus according to claim 2, wherein the first pressure is above atmospheric pressure.

4. The apparatus according to claim 2, wherein the second pressure is substantially equal to atmospheric pressure.

5. The apparatus according to claim 2, further comprising a pressure monitor, arranged to monitor the difference in pressure between the first pressure and the second pressure.

6. The apparatus according to claim 2, wherein the stressing assembly comprises a chamber, the chamber comprising a first region arranged to be maintained at the first pressure and a second region arranged to be maintained at the second pressure.

7. The apparatus according to claim 6, wherein the first region comprises a gas inlet.

8. The apparatus according to claim 6, wherein the first region comprises a leak valve.

9. The apparatus according to claim 6, wherein the film support is arranged in the chamber and disposed around an inner surface of the chamber between the first region and the second region.

10. The apparatus according to claim 9, where the film support defines a circular aperture between the first region and the second region.

11. The apparatus according to claim 10, wherein the substrate support comprises a flat circular surface arranged parallel with and concentric with the circular aperture.

12. The apparatus according to claim 1, further comprising a stress monitor, arranged to monitor a property of the film indicative of the stress in the film.

13. The apparatus according to claim 12, wherein the stress monitor is a deflection monitor.

14. A pellicle manufactured using the apparatus according to claim 1.

* * * * *